United States Patent
Turner et al.

(10) Patent No.: US 9,108,842 B2
(45) Date of Patent: Aug. 18, 2015

(54) REDUCING MICROELECTROMECHANICAL SYSTEMS STICTION BY FORMATION OF A SILICON CARBIDE LAYER

(71) Applicants: Michael D. Turner, San Antonio, TX (US); Ruben B. Montez, Cedar Park, TX (US)

(72) Inventors: Michael D. Turner, San Antonio, TX (US); Ruben B. Montez, Cedar Park, TX (US)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 13/946,729

(22) Filed: Jul. 19, 2013

(65) Prior Publication Data

US 2015/0021717 A1    Jan. 22, 2015

(51) Int. Cl.
*B81C 1/00* (2006.01)
*B81B 3/00* (2006.01)

(52) U.S. Cl.
CPC ............ *B81C 1/0038* (2013.01); *B81B 3/0005* (2013.01)

(58) Field of Classification Search
USPC ......................................................... 257/415
See application file for complete search history.

(56) References Cited

U.S. PATENT DOCUMENTS

| | | | |
|---|---|---|---|
| 5,658,710 A * | 8/1997 | Neukermans | 430/320 |
| 7,477,441 B1 | 1/2009 | Zhang et al. | |
| 7,692,839 B2 | 4/2010 | Palmateer et al. | |
| 2002/0184907 A1 | 12/2002 | Vaiyapuri et al. | |
| 2008/0050861 A1 | 2/2008 | Vancura et al. | |
| 2010/0159627 A1 * | 6/2010 | Partridge et al. | 438/51 |
| 2011/0127622 A1 | 6/2011 | Rudhard et al. | |

* cited by examiner

*Primary Examiner* — Zandra Smith
*Assistant Examiner* — Lawrence Tynes, Jr.
(74) *Attorney, Agent, or Firm* — Jonathan N. Geld

(57) ABSTRACT

A mechanism is provided for reducing stiction in a MEMS device by forming a near-uniform silicon carbide layer on silicon surfaces using carbon from TEOS-based silicon oxide sacrificial films used during fabrication. By using the TEOS as a source of carbon to form an antistiction coating, all silicon surfaces can be coated, including those that are difficult to coat using standard self-assembled monolayer (SAM) processes (e.g., locations beneath the proof mass). Controlled processing parameters, such as temperature, length of time for annealing, and the like, provide for a near-uniform silicon carbide coating not provided by previous processes.

19 Claims, 3 Drawing Sheets

REDUCING MICROELECTROMECHANICAL SYSTEMS STICTION BY FORMATION OF A SILICON CARBIDE LAYER

BACKGROUND

1. Field

This disclosure relates generally to manufacture of microelectromechanical systems (MEMS), and more specifically, to reducing stiction in MEMS devices through formation of a silicon carbide layer on polysilicon surfaces that come in contact in the MEMS devices.

2. Related Art

Microelectromechanical systems (MEMS) devices are micromechanical devices that provide moving parts having features with dimensions below 100 μm. These moving parts are formed using micro-fabrication techniques. MEMS devices have holes, cavities, channels, cantilevers, membranes, and the like. These devices are typically based on silicon materials and use a variety of techniques to form the physical structures and to free the structures for movement.

Stiction is a static friction force that is a recurring problem with typical MEMS devices. While any solid objects pressing against each other without sliding require some threshold of force (stiction) to overcome static cohesion, the mechanisms generating this force can be different for MEMS devices. When two surfaces with areas below the micrometer range come into close proximity, the surfaces may adhere together due to electrostatic and/or Van der Waals forces. Stiction forces at this scale may also be related to hydrogen bonding or residual contamination on the surfaces.

For MEMS devices such as accelerometers, surfaces such as over-travel stops can come into close proximity or contact during use at the limits of the device design or during manufacture of the device. In those situations, stiction forces can cause the MEMS device parts (e.g., a teeter-totter accelerometer mechanism) to freeze in place and become unusable. Traditional methods of avoiding such close proximity travel or contact include increasing spring constants and increasing distance between parts of the MEMS device. But these methods can cause decreased sensitivity of the device due to acceleration, and therefore decreased utility of the MEMS device. It is therefore desirable to provide a mechanism for reducing stiction-related interactions of MEMS devices without also decreasing sensitivity of the MEMS device.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The figures are not necessarily drawn to scale.

DETAILED DESCRIPTION

Embodiments of the present invention provide a mechanism for reducing stiction in a MEMS device by forming a near-uniform silicon carbide layer on silicon surfaces using carbon from TEOS-based silicon oxide sacrificial films used during fabrication. By using the TEOS as a source of carbon to form an antistiction coating, all silicon surfaces can be coated, including those that are difficult to coat using standard self-assembled monolayer (SAM) processes (e.g., locations beneath the proof mass). Controlled processing parameters, such as temperature, length of time for annealing, and the like, provide for a near-uniform silicon carbide coating not provided by previous processes.

Figure 1:
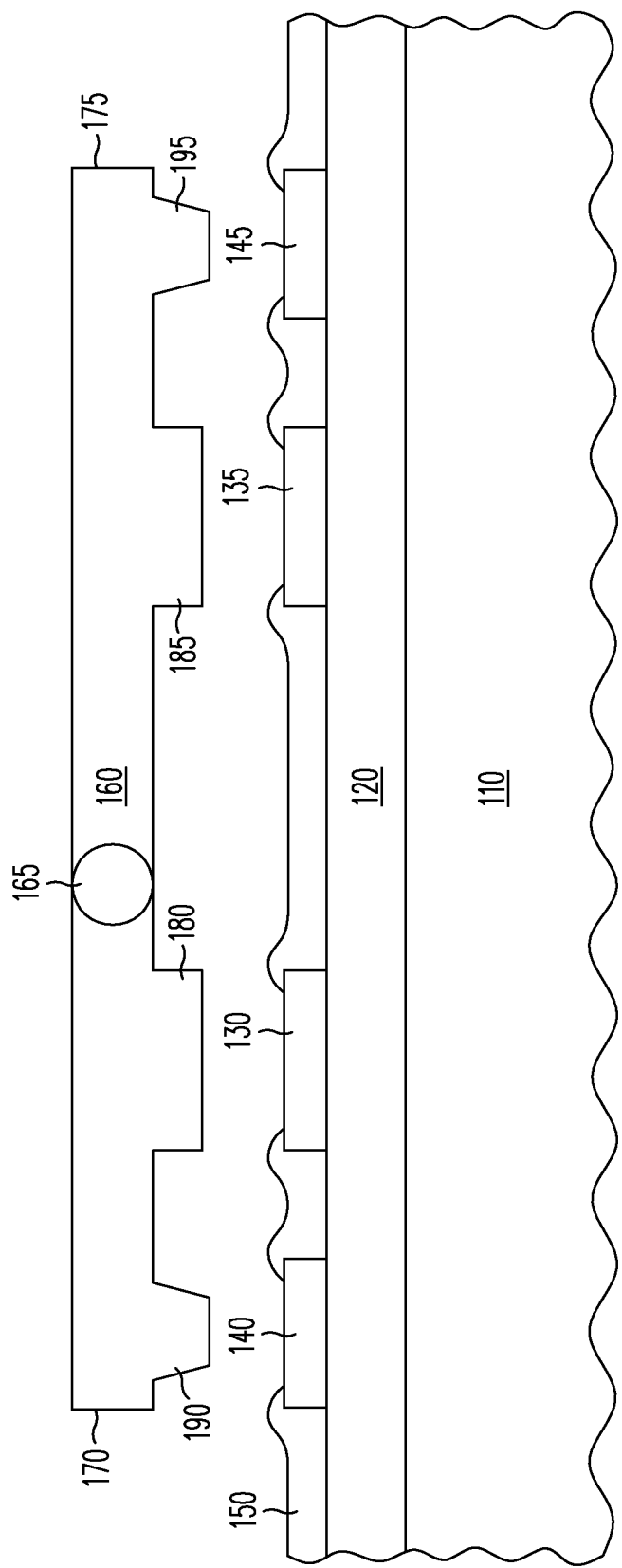
FIG. 1 is a simplified block diagram illustrating a cross section view of an accelerometer known in the art.

FIG. 1 is a simplified block diagram illustrating a cross section view of a teeter totter accelerometer known in the prior art. The accelerometer includes a substrate 110 with an insulating layer 120. Substrate 110 can be, for example, a silicon wafer and insulating layer 120 can be, for example, a silicon oxide or silicon nitride. In some cases, insulating layer 120 can be thermally grown from substrate 110 or the insulating layer can be deposited.

Fixed electrodes 130 and 135 are formed on top of insulating layer 120, along with travel stop regions 140 and 145. The layer forming fixed electrodes 130 and 135 and travel stop regions 140 and 145 is typically polysilicon and is formed using conventional techniques, including patterning as desired for the application. The layer forming the fixed electrodes and travel stop regions can alternatively be crystalline silicon, amorphous silicon, a nitride, a metal-containing material, another suitable material, and the like, or any combination thereof. A dielectric layer 150 is formed to electrically isolate the electrodes and travel stop regions from other elements of the MEMS accelerometer. Dielectric layer 150 can be formed from a variety of materials, including, for example, silicon nitride, silicon dioxide, silicon oxynitride, and the like.

A pivoting proof mass 160 is configured to move in a manner similar to that of a teeter totter in response to acceleration of the MEMS device or a system incorporating the MEMS device. Pivoting proof mass 160 can be configured in a manner such that there is an imbalance between a side 170 of the pivoting proof mass and side 175 of the pivoting proof mass through pivot point 165. The amount of imbalance has an effect of making the device more or less sensitive to acceleration. An electrode 180 configured on side 170 of the pivoting proof mass is associated with fixed electrode 130, while an electrode 185 on the pivoting proof mass is associated with fixed electrode 135. In addition, a travel stop 190 on side 170 of the pivoting proof mass is associated with travel stop region 140 and a travel stop 195 on side 175 of the pivoting proof mass is associated with travel stop region 145. Pivoting proof mass 160 and travel stops 190 and 195 are typically formed of polysilicon.

Electrode 180 and fixed electrode 130 form a first variable sense capacitor, while electrode 185 and fixed electrode 135 form a second variable sense capacitor. Changes in the capacitances of the first and second variable sense capacitors can be combined to provide a differential output from the MEMS accelerometer. Fabrication of the MEMS accelerometer in FIG. 1 can be performed using known MEMS processes.

Figure 2:
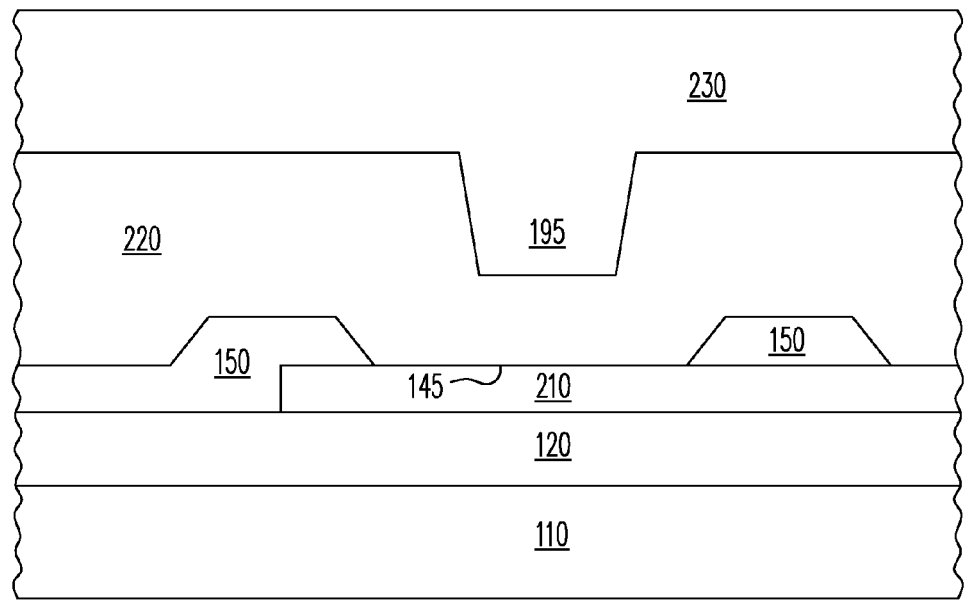
FIG. 2 is a simplified block diagram illustrating a close up of a cross-section view of the travel stop region at an end of a MEMS accelerometer during a stage of fabrication.

FIG. 2 is a simplified block diagram illustrating a close up of a cross section view of the travel stop region at end 175 of the MEMS accelerometer during a stage of fabrication. As discussed above, a substrate 110 is provided with insulating layer 120, where substrate 110 can be a silicon wafer and insulating layer 120 can be a silicon oxide. A first polysilicon layer 210 is formed on insulating layer 120, forming, in part, travel stop region 145. The first polysilicon layer can be formed using, for example, a rapid thermal process deposition. In addition, the first polysilicon layer can be doped with, for example, phosphorus. Alternatively, as discussed above, travel stop region 145 can be formed using amorphous or crystalline silicon, for example. Dielectric layer 150 is formed over polysilicon layer 210 and insulating layer 120, in order to prevent excessive etching of insulating layer 120, for example.

A sacrificial layer 220 is formed on top of patterned dielectric layer 150 and exposed regions of polysilicon layer 210. Sacrificial layer 220 is formed using tetraethyl orthosilicate (TEOS) gas to form a sacrificial layer of silicon oxide. The sacrificial layer can be patterned to form a "molding" for the next layer of the MEMS device. A second polysilicon layer 230 can be formed on the patterned sacrificial layer to form pivoting proof mass 160, including travel stop 195. The buildup of patterned layers can continue as needed for the application.

Figure 3:
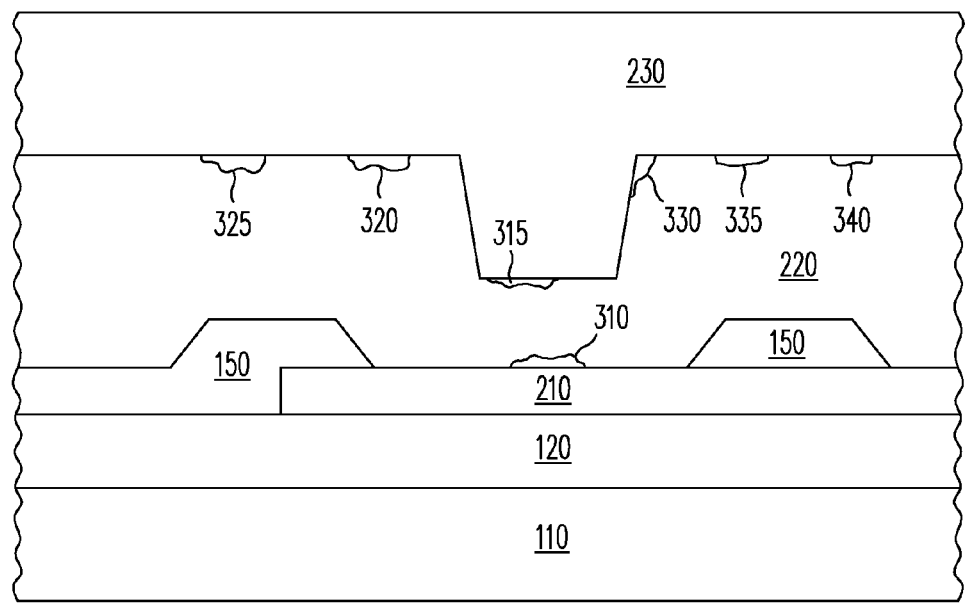
FIG. 3 is a simplified block diagram illustrating a cross-section view of the travel stop region during a stage of fabrication subsequent to deposition of a second polysilicon layer.

FIG. 3 is a simplified block diagram illustrating a cross-section view of the travel stop region during a stage of fabrication subsequent to deposition of second polysilicon layer 230. Typical MEMS processing provides for the second polysilicon layer to be deposited at low temperature and low pressure. In one embodiment, in order to relieve stresses on second polysilicon layer 230, the structure is annealed by subjecting the structure to temperatures in excess of 1000 C for an hour or more. During this anneal, the polysilicon grains in polysilicon layer 230 realign and thereby reduce intrinsic stress, providing a low energy, relaxed polysilicon structure in the resulting device.

During the second anneal, the entire MEMS device structure is subjected to the heating, including sacrificial layer 220. As stated above, sacrificial layer 220 is a silicon oxide layer formed using TEOS gas. TEOS includes a significant amount of carbon chains that get incorporated into the sacrificial layer. During the second anneal heating, volatile compounds in the sacrificial layer are released from the layer, but carbon remains within the sacrificial layer. Further, under typical anneal conditions, carbon in the sacrificial layer that is near the silicon layers can diffuse into the surfaces of the silicon layers and form non-uniform carbon deposits along the interface region between the polysilicon layers and the sacrificial layer (e.g., carbon deposits 310, 315, 320, 325, 330, 335, and 340).

Figure 4:
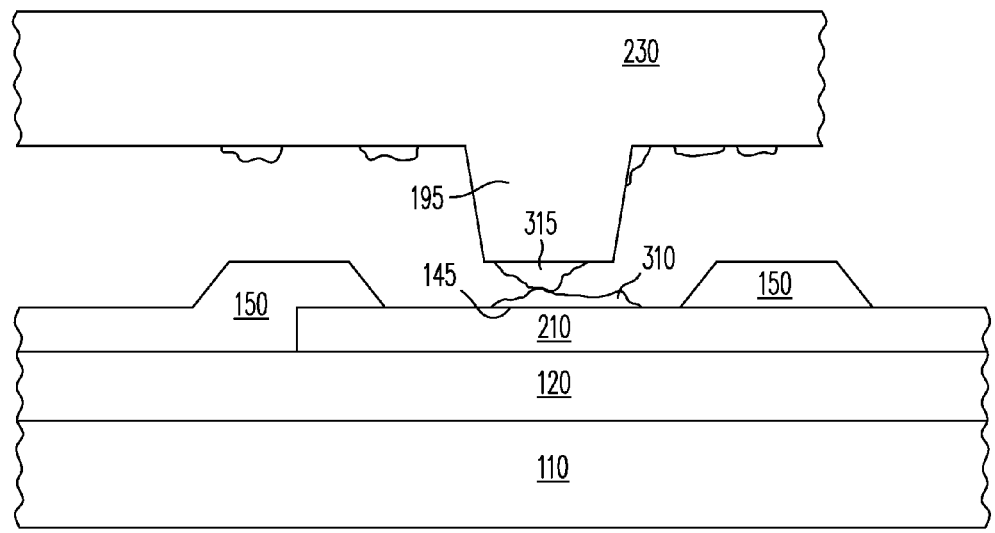
FIG. 4 is a simplified block diagram illustrating a cross-section view of the travel stop region subsequent to removal of a sacrificial layer, in a position that can occur during use of the accelerometer or during removal of the sacrificial layer.

FIG. 4 is a simplified block diagram illustrating a cross-section view of the travel stop region subsequent to removal of the sacrificial layer, in a position that can occur during use of the accelerometer or during removal of the sacrificial layer. Sacrificial layer 220 is commonly removed using an isotropic wet etch process selective to the sacrificial layer. But capillary forces due to surface tension of the liquid used for the etching process between travel stop 195 and polysilicon travel stop region 145 can draw the surfaces together. As illustrated, a consequence of the surfaces being drawn together results in bringing the non-uniform carbon deposits 310 and 315 into contact. A surface having non-uniform carbon deposits can be significantly more susceptible to adhesion than a surface not having such deposits, especially if the carbon region is wet such as during a wet etching process.

Similarly, the surfaces having carbon masses can be brought into contact during use of the device. For example, if an acceleration A sufficient to exceed the design specification for the accelerometer is exerted upon the device. This causes travel stop 195 to impact travel stop region 145, thereby preventing contact of electrode 185 to fixed electrode 135. In this case, stiction forces due to the carbon masses, along with other sources of stiction (e.g., Van der Waals forces and electrostatic forces) can cause the parts to stay together and render the device inoperable.

It has been found that silicon carbide, in a uniform layer (rather than the non-uniform carbon deposits discussed above), acts as an anti-stiction coating and will consequently reduce stiction during etching and use of the device. Embodiments of the present invention provide a mechanism to uniformly form silicon carbide on the silicon surfaces of, for example, both travel stop 195 and travel stop region 145 in a MEMS device. This is accomplished by controlling process parameters of the TEOS deposition of the sacrificial layer and subsequent annealing ambients (e.g., temperature and time). In addition, by controlling when anneals are performed, silicon carbide can be formed on one silicon surface but not the other, depending on the needs of the application.

Figure 5:
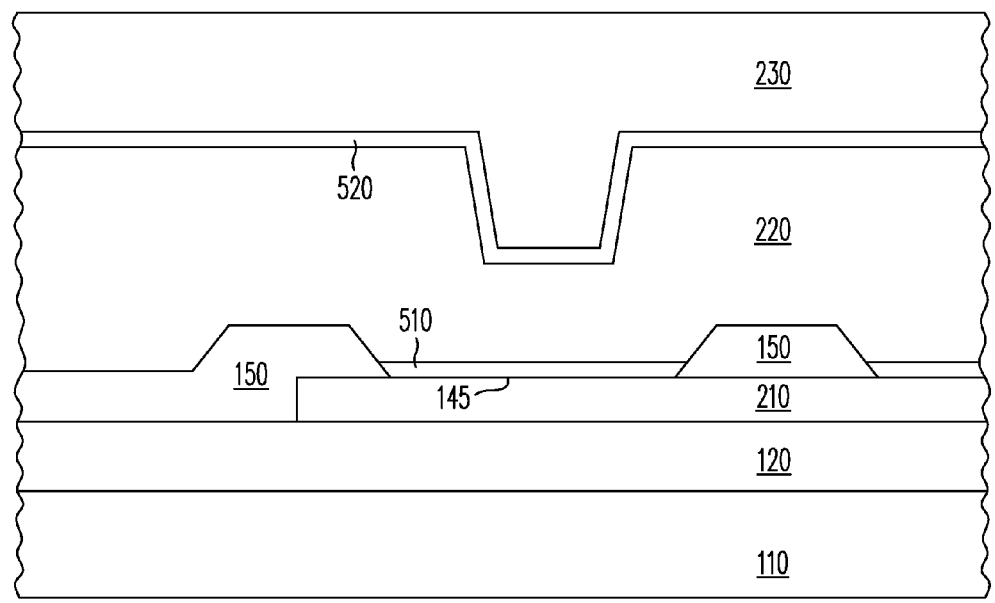
FIG. 5 is a simplified block diagram illustrating a cross-sectional view of the travel stop region during a step in processing, in accord with embodiments of the present invention.

FIG. 5 is a simplified block diagram illustrating a cross-sectional view of the travel stop region of a MEMS device during a step in processing, in accord with embodiments of the present invention. As discussed above, the travel stop region is formed over substrate 110 and insulating layer 120. First polysilicon layer 210 is formed over insulating layer 120, forming, in part, travel stop region 145. Dielectric layer 150 is formed over patterned polysilicon layer 210, again to electrically isolate patterned regions of the polysilicon layer.

As discussed above, sacrificial layer 220 is formed using TEOS gas to provide the sacrificial layer of silicon oxide. Once the sacrificial layer is formed, then a silicon carbide layer 510 can be formed on surface of first polysilicon layer 210 through an annealing process. A thickness and quality of silicon carbide layer 510 can be controlled by, for example, selecting a temperature and length of time for the anneal process. Stability of the silicon carbide layer is also sensitive to anneal temperature and length of time. The annealing process diffuses carbon out of TEOS sacrificial layer 220 and into/onto first polysilicon layer 210 (or, as discussed above, an amorphous or crystalline silicon layer). Using contact angle goniometry testing, it has been determined that an anneal at approximately 1080 C for approximately two hours provides a time-stable silicon carbide layer that is of a sufficient thickness (e.g., 300-500 Å) to protect travel stop region 145, while at the same time providing stiction reduction by virtue of being uniform. By contrast, prior art self-assembled monolayers are typically about 10-15 Å in thickness, and can be damaged or worn away during use of the accelerometer.

Subsequent to formation of silicon carbide layer 510, second polysilicon layer 230 is formed using a low temperature, low pressure deposition process. Typically, an anneal can then be performed to relieve stresses in the second polysilicon layer. In addition, if the application calls for a second silicon carbide layer, the process parameters for the second anneal can be adjusted to allow for diffusion of carbon from the TEOS layer region near second polysilicon layer 230 to second polysilicon layer 230. As with the previously discussed anneal for the first polysilicon layer, heating to temperatures of approximately 1080 C for approximately two hours will produce a time-stable silicon carbide layer 520 usable for stiction reduction. In one alternative embodiment, a single anneal can be performed to generate silicon carbide layers 510 and 520, after second polysilicon layer 230 is formed.

In one embodiment of the present invention, two silicon carbide layers can be used, as shown, to address stiction-related issues. In another embodiment, either one of silicon carbide layers 510 and 520 can be used to alleviate stiction. Once the desired silicon carbide layers are formed, sacrificial layer 220 is removed using a wet etch.

Silicon carbide layers have been shown to be successful anti-stiction coatings. Typically, such layers are formed using deposition or other techniques (e.g., SAM layers). But such techniques cannot provide a dependable coating in regions underneath structures, such as those present in MEMS devices (e.g., silicon carbide layer 520). Through the use of the techniques described above, a silicon carbide coating can be formed on any polysilicon surface in contact with a carbon-containing sacrificial layer, such as TEOS.

In addition, one advantage of reducing stiction in accelerometer-type MEMS devices is improved sensitivity of the device. In one type of traditional MEMS accelerometer, stiction force is countered by increasing a spring constant of the device. But increasing the spring constant decreases sensitivity of the MEMS device to light acceleration forces. In another type of traditional MEMS device, chances for stiction occurring are sought to be reduced by increasing the distance between the movable portions of the device and the fixed portions of the device. But this increases the distance between the capacitive plates and can therefore decrease differences in measured capacitance. Reducing stiction forces by using embodiments of the present invention allow for lower spring constants and smaller distances between parts, both of which can improve device sensitivity. Further, smaller overall device sizes can be realized by decreasing the distances between the parts. This can, in turn, provide a decreased footprint for each MEMS device, thereby allowing for incorporation of more MEMS devices in a system or a smaller system size.

By now it should be realized that a method for manufacturing a microelectromechanical systems device has been provided. The method includes forming a first silicon layer over a substrate, forming a sacrificial layer over the first silicon layer where the sacrificial layer include silicon oxide deposited using tetraethyl orthosilicate gas, and annealing the first silicon layer and the sacrificial layer. The annealing includes heating the first silicon layer and the sacrificial layer to a temperature sufficient to form a silicon carbide layer at an interface region between the first silicon layer and the sacrificial layer. The silicon carbide layer includes carbon provided by the sacrificial layer.

In one aspect of the above embodiment, the annealing includes heating the first silicon layer and the sacrificial layer to at least 1000 C for at least one hour. In a further aspect of the above embodiment, the annealing includes heating the first silicon layer and the sacrificial layer to at least 1180 C for at least two hours. In another aspect of the above embodiment, the annealing includes heating the first silicon layer and the sacrificial layer to a temperature sufficient to form the silicon carbide layer to have a thickness of 300-500 Å.

In another aspect of the above embodiment the method further includes forming a second silicon layer over the sacrificial layer. In a further aspect, the method further includes annealing the second silicon layer and the sacrificial layer wherein said annealing includes heating the second silicon layer and the sacrificial layer to a temperature sufficient to form a silicon carbide layer at an interface region between the second silicon layer and the sacrificial layer. The silicon carbide layer includes carbon provided by the sacrificial layer. In another further aspect, the method further includes removing the sacrificial layer subsequent to forming the second silicon layer. The removing includes using one of a wet etch or a vapor phase etch.

In another aspect of the above embodiment, the method further includes removing the sacrificial layer subsequent to annealing the first silicon layer and the sacrificial layer where removing includes using one of a wet etch or a vapor phase etch. In another aspect of the above embodiment, the method further includes forming a first insulating layer over the substrate where the first silicon layer is one of a polysilicon layer or an amorphous silicon layer formed over the first insulating layer, and forming a second insulating layer over at least a portion of the first silicon layer.

Another embodiment of the present invention provides a microelectromechanical systems device that includes a fixed surface including a first silicon layer formed over a substrate and a first insulating layer formed over at least a portion of the first silicon layer, a movable body including a second silicon layer providing a major surface facing the fixed surface, and a uniform silicon carbide layer formed on at least one of the first silicon layer and the major surface of the second silicon layer. In one aspect of the above embodiment, the uniform silicon carbide layer includes carbon from a TEOS sacrificial layer. In another aspect of the above embodiment, the uniform silicon carbide layer is between about 300 Å to about 500 Å in thickness. In another aspect of the above embodiment, the uniform silicon carbide layer is formed at least on the major surface of the second silicon layer. In another aspect of the above embodiment, the MEMS device includes one or more of an accelerometer and a gyroscope.

In another embodiment of the present invention a method is provided for manufacturing a microelectromechanical systems device. The method includes: forming a fixed surface including a first layer of silicon; forming a movable body that provides a major surface facing the fixed surface; forming a sacrificial layer between the fixed surface and the movable body where the sacrificial layer includes carbon and silicon oxide deposited using tetraethyl orthosilicate gas; and, forming at least one of the first layer of silicon or a second layer of silicon such that the carbon from the sacrificial layer forms a uniform layer of silicon carbide on at least one of the first layer or second layer of silicon. At least a portion of the major surface of the movable body is configured to contact at least a portion of the fixed surface and the at least a portion of the major surface includes the second layer of silicon.

In one aspect of the above embodiment, the forming of at least one of the first layer of silicon or the second layer of silicon such that the carbon from the sacrificial layer forms a uniform layer of silicon carbide on at least one of the first layer or second layer of silicon and further includes annealing the first layer of silicon and the sacrificial layer. The annealing includes heating the first silicon layer and the sacrificial layer to a temperature sufficient for the silicon carbide layer to form at an interface between the first silicon layer and the sacrificial layer. In a further aspect, the annealing includes heating the first layer of silicon and the sacrificial layer to at least 1000 C for at least one hour. In still a further aspect, the annealing includes heating the first layer of silicon and the sacrificial layer to at least 1180 C for at least two hours. In another further aspect, the annealing includes heating the first layer of silicon and the sacrificial layer to a sufficient temperature and a time sufficient to form a silicon carbide layer having a thickness of 300-500 Å.

In another aspect of the above embodiment, forming at least one of the first layer of silicon or the second layer of silicon such that the carbon from the sacrificial layer forms a uniform layer of silicon carbide on at least one of the first layer or second layer of silicon further includes annealing the second layer of silicon and the sacrificial layer. The annealing includes heating the second silicon layer and the sacrificial layer to a temperature sufficient for the silicon carbide layer to form at an interface between the second silicon layer and the sacrificial layer.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

It is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the invention is described herein with reference to specific embodiments, various modifications and changes can be made without departing from the scope of the present invention as set forth in the claims below. For example, the description of embodiments of the invention relates to a teeter-totter type accelerometer. Embodiments of the present invention are not limited to teeter-totter accelerometers, but can include accelerometers having a mass suspended by springs, or other MEMS devices that have a potential for components to come in contact with one another during operation or manufacture. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for manufacturing a microelectromechanical systems (MEMS) device, the method comprising:
    forming a first silicon layer over a substrate;
    forming a sacrificial layer over the first silicon layer, wherein the sacrificial layer comprises silicon oxide deposited using tetraethyl orthosilicate (TEOS) gas;
    annealing the first silicon layer and the sacrificial layer wherein said annealing comprises heating the first silicon layer and the sacrificial layer to a temperature sufficient to form a silicon carbide layer at an interface region between the first silicon layer and the sacrificial layer, wherein the silicon carbide layer comprises carbon provided by the sacrificial layer.

2. The method of claim 1 wherein said annealing comprises heating the first silicon layer and the sacrificial layer to at least 1000 C for at least one hour.

3. The method of claim 2 where said annealing comprises heating the first silicon layer and the sacrificial layer to at least 1180 C for at least two hours.

4. The method of claim 1 wherein said annealing comprises heating the first silicon layer and the sacrificial layer to a temperature sufficient to form the silicon carbide layer to have a thickness of 300-500 Å.

5. The method of claim 1 further comprising forming a second silicon layer over the sacrificial layer.

6. The method of claim 5 further comprising:
    annealing the second silicon layer and the sacrificial layer wherein said annealing comprises heating the second silicon layer and the sacrificial layer to a temperature sufficient to form a silicon carbide layer at an interface region between the second silicon layer and the sacrificial layer, wherein the silicon carbide layer comprises carbon provided by the sacrificial layer.

7. The method of claim 5 further comprising:
    removing the sacrificial layer subsequent to said forming the second silicon layer, wherein said removing comprises using one of a wet etch or a vapor phase etch (VPE).

8. The method of claim 1 further comprising:
    removing the sacrificial layer subsequent to said annealing the first silicon layer and the sacrificial layer, wherein said removing comprises using one of a wet etch or a VPE.

9. The method of claim 1 further comprising:
    forming a first insulating layer over the substrate, wherein the first silicon layer is one of a polysilicon layer or an amorphous silicon layer formed over the first insulating layer; and
    forming a second insulating layer over at least a portion of the first silicon layer.

10. A microelectromechanical systems (MEMS) device comprising:

a fixed surface comprising a first silicon layer formed over a substrate and a first insulating layer formed over at least a portion of the first silicon layer;

a moveable body comprising a second silicon layer providing a major surface facing the fixed surface; and a uniform silicon carbide layer formed on at least one of the first silicon layer and the major surface of the second silicon layer, wherein the uniform silicon carbide layer comprises carbon from a TEOS sacrificial layer.

11. The MEMS device of claim 10 wherein the uniform silicon carbide layer is between about 300 Å to about 500 Å in thickness.

12. The MEMS device of claim 10 wherein the uniform silicon carbide layer is formed at least on the major surface of the second silicon layer.

13. The MEMS device of claim 10 wherein the MEMS device comprises one or more of an accelerometer and a gyroscope.

14. A method of manufacturing a microelectromechanical systems (MEMS) device, the method comprising:

forming a fixed surface comprising a first layer of silicon;

forming a movable body providing a major surface facing the fixed surface, wherein at least a portion of the major surface is configured to contact at least a portion of the fixed surface and the at least a portion of the major surface comprises a second layer of silicon;

forming a sacrificial layer between the fixed surface and the movable body, wherein the sacrificial layer comprises carbon and silicon oxide deposited using tetraethyl orthosilicate (TEOS) gas; and forming at least one of the first layer of silicon or the second layer of silicon such that the carbon from the sacrificial layer forms a uniform layer of silicon carbide on at least one of the first layer or second layer of silicon.

15. The method of claim 14 wherein said forming at least one of the first layer of silicon or the second layer of silicon such that the carbon from the sacrificial layer forms a uniform layer of silicon carbide on at least one of the first layer or second layer of silicon further comprises:

annealing the first layer of silicon and the sacrificial layer, wherein said annealing comprises heating the first silicon layer and the sacrificial layer to a temperature sufficient for the silicon carbide layer to form at an interface between the first silicon layer and the sacrificial layer.

16. The method of claim 15 wherein said annealing comprises heating the first layer of silicon and the sacrificial layer to at least 1000 C for at least one hour.

17. The method of claim 16 where said annealing comprises heating the first layer of silicon and the sacrificial layer to at least 1180 C for at least two hours.

18. The method of claim 15 wherein said annealing comprises heating the first layer of silicon and the sacrificial layer to a sufficient temperature and a time sufficient to form a silicon carbide layer having a thickness of 300-500 Å.

19. The method of claim 14 wherein said forming at least one of the first layer of silicon or the second layer of silicon such that the carbon from the sacrificial layer forms a uniform layer of silicon carbide on at least one of the first layer or second layer of silicon further comprises:

annealing the second layer of silicon and the sacrificial layer, wherein said annealing comprises heating the second silicon layer and the sacrificial layer to a temperature sufficient for the silicon carbide layer to form at an interface between the second silicon layer and the sacrificial layer.

* * * * *